(12) United States Patent
Atkins et al.

(10) Patent No.: US 7,859,375 B2
(45) Date of Patent: Dec. 28, 2010

(54) ELECTROMAGNET

(75) Inventors: Andrew Farquhar Atkins, Nr Banbury (GB); Graham Gilgrass, Wallingford (GB); Andrew James Gray, Bicester (GB)

(73) Assignee: Siemens Plc, Frimley, Camberley, Surrey (GB)

( * ) Notice: Subject to any disclaimer, the term of this patent is extended or adjusted under 35 U.S.C. 154(b) by 0 days.

(21) Appl. No.: 12/060,666

(22) Filed: Apr. 1, 2008

(65) Prior Publication Data

US 2009/0039991 A1 Feb. 12, 2009

Related U.S. Application Data

(63) Continuation of application No. 11/441,129, filed on May 26, 2006, now abandoned.

(30) Foreign Application Priority Data

May 26, 2005 (GB) ................... 0510716.4

(51) Int. Cl.
| | |
|---|---|
| H01F 1/00 | (2006.01) |
| H01F 6/00 | (2006.01) |
| H01F 13/00 | (2006.01) |
| H01F 3/00 | (2006.01) |
| H01F 7/00 | (2006.01) |
| H01F 5/00 | (2006.01) |

(52) U.S. Cl. ................. 335/216; 335/284; 335/296; 335/299; 335/300

(58) Field of Classification Search ......... 335/216–301; 505/892; 62/50.1

See application file for complete search history.

(56) References Cited

U.S. PATENT DOCUMENTS

| 3,416,111 A | * | 12/1968 | Bogner ..................... 336/60 |
| 3,595,982 A | * | 7/1971 | Kafka .................... 174/15.5 |
| 3,736,365 A | * | 5/1973 | Bobo et al. ............... 174/15.5 |
| 3,946,348 A | * | 3/1976 | Schleich ................. 335/216 |
| 4,394,534 A | * | 7/1983 | Bahder et al. ............. 174/15.5 |
| 4,549,156 A | * | 10/1985 | Mine et al. ................. 335/216 |
| 4,640,005 A | * | 2/1987 | Mine et al. ................. 29/599 |
| 4,808,954 A | * | 2/1989 | Ito ........................... 335/216 |

(Continued)

FOREIGN PATENT DOCUMENTS

EP 0350267 A1 1/1990

(Continued)

OTHER PUBLICATIONS

Great Britain Search Report dated Aug. 31, 2005 (Three (3) pages).

(Continued)

*Primary Examiner*—Elvin G Enad
*Assistant Examiner*—Mohamad A Musleh
(74) *Attorney, Agent, or Firm*—Crowell & Moring LLP

(57) ABSTRACT

An electromagnet comprising a plurality of coils of superconductive material, monolithically embedded in an embedding material, which is solid at the temperature of operation of the superconductive electromagnet, and a method for producing an electromagnet comprising a plurality of coils of superconductive material, comprising the steps of winding coils of superconductive material, retaining the coils at predetermined relative positions, and monolithically embedding the plurality of superconducting coils in an embedding material, which is solid at the temperature of operation of the superconductive electromagnet.

13 Claims, 2 Drawing Sheets

U.S. PATENT DOCUMENTS

| | | | |
|---|---|---|---|
| 4,924,198 A * | 5/1990 | Laskaris | 505/211 |
| 5,332,972 A | 7/1994 | Takenouchi | |
| 5,404,122 A * | 4/1995 | Maeda et al. | 335/216 |
| 5,532,663 A * | 7/1996 | Herd et al. | 335/216 |
| 5,630,415 A | 5/1997 | Kaufman | |
| 5,689,223 A | 11/1997 | Demarmels et al. | |
| 5,774,032 A * | 6/1998 | Herd et al. | 335/216 |
| 2007/0120630 A1 * | 5/2007 | Huang et al. | 335/216 |

FOREIGN PATENT DOCUMENTS

| | | |
|---|---|---|
| EP | 0 350 267 B1 | 6/1993 |
| JP | 57-75406 A | 5/1982 |
| JP | 3-240206 A | 10/1991 |
| JP | 5-159958 A | 6/1993 |
| JP | 10-83928 A | 3/1998 |

OTHER PUBLICATIONS

Office Action dated Apr. 13, 2010 in Chinese Patent Application No. 200610087806.4.

* cited by examiner

ELECTROMAGNET

The present invention relates to an electromagnet assembly. More particularly it relates to a particularly advantageous mounting and retaining element for coils and other conductors of an electromagnet. More particularly still, it relates to a cryogenically cooled superconducting electromagnet.

MRI or NMR imaging systems are used for medical diagnosis. A requirement of such a system is a stable, homogeneous, magnetic field. Typically, cryogenically cooled superconducting electromagnets are employed. In order to achieve stability it is common to use a superconducting magnet system which operates at very low temperature. The temperature is maintained by cooling the superconductor, typically by immersion in a low temperature cryogenic fluid such as liquid helium. Cryogenic fluids, and particularly helium, are expensive and it is desirable that the magnet system should be designed and operated in a manner to reduce to a minimum the amount of cryogenic fluid used.

The present invention relates to an inexpensive yet effective way of retaining superconductive coils and other conductors in place during ramping and operation of an electromagnet.

FIG. 4 illustrates a hollow cylindrical cryostat 1 suitable for housing a solenoidal superconducting magnet for an MRI system, according to the prior art. The superconducting magnet system 2 typically comprises a set of superconductor windings 12 for producing a magnetic field, wound on a former 10. A cryogenic fluid vessel 14 contains the superconductor windings and holds the low temperature cryogenic fluid, when in operation. One or more thermal shields 18 substantially surround the cryogenic fluid vessel 14, and an outer vacuum chamber 16 completely encloses the thermal shield(s) and the cryogenic fluid vessel 14.

The shield(s) reduce(s) the incidence of radiated heat from the outer vacuum chamber 16 which may reach the cryogen vessel 14. A service neck 20 is typically included. In operation, this neck may house a recondensing refrigerator 21.

It is common practice to use a refrigerator 21 to cool the thermal shields 18 to a low temperature in order to reduce the heat load onto the cryogenic fluid vessel 14, and thus the loss of cryogen, for example liquid helium (not shown in FIG. 4), by boil-off. It is also known to use a refrigerator 21 to directly refrigerate the cryogen vessel 14, thereby reducing or eliminating cryogen fluid consumption.

An object of the present invention is to reduce the likelihood of unintentional quench of a superconducting electromagnet during operation. A quench occurs when a superconductor, such as used in superconducting magnets, reverts to a resistive state. This may be caused, for example, by localized heating in one part of the superconductor, either due to local movement or friction. For any of these reasons, a small part of the superconductor ceases to be superconductive, and enters a resistive state. Any current flowing through the resistive part will cause local Joule heating. This will cause the adjacent parts of the superconductor to quench, resulting in a larger resistive part, in turn causing further Joule heating. Very rapidly, a large part of the superconductor enters a resistive state, with a potentially very large current still flowing. When this happens, a large part of the stored field energy, which may be in the order of several mega joules, will be dissipated as heat. If this process is not adequately managed, this heat may be dissipated in confined areas, resulting in local temperature rises which can damage the coil areas at or near the part where the quench was initiated.

As mentioned above, one possible cause for a quench in a superconducting magnet is localised heating due to movement of a conductor. Since electromagnets such as used in imaging systems include conductors carrying very high currents in a very strong magnetic field, appreciable forces are experienced by the conductors. Any freedom of a conductor to move, even slightly, may lead to sufficient localised heating to cause quench of the magnet when in operation.

At least two different mechanisms can be identified for movement of superconducting wires. For convenience, these are commonly referred to as 'ramp shift' and 'stick shift'. When a magnet is being brought into operation, the coils and the former on which they are wound are cooled to operating temperature. Different thermal expansion of the coils, the former and other materials used may mean that the wires of the coils become free to move slightly. The magnitude of current flowing in the magnet coils is ramped. The magnetic field may act on the current-carrying wires of the coils to displace them from their former position. This is known as ramp shifting. The displaced wires cause a variation on the homogeneity of the magnetic field produced, and a re-shimming process will be required to compensate for this variation. Instead of a gentle movement, the wires may initially stick in one place, and when the force on them has built up to a certain level, the wire may suddenly move. This sudden movement may be sufficient to cause a quench. One object of the present invention is to prevent any such movement, either 'ramp shift' or 'stick shift', thereby avoiding the problems of quench, or the need for reshimming caused by such movement.

Conventional superconducting electromagnets are cooled by immersion in a bath of liquid cryogen, for example liquid helium. The temperature of the bath is maintained by boiling off the liquid cryogen. It is necessary to provide a recondensing refrigerator to recondense boiled-off helium back to a liquid state, or the boiled off cryogen must be vented to the atmosphere.

A difficulty arises when the system is in transit, awaiting installation. Typically, the system is transported filled with liquid cryogen, but the recondensing refrigerator 21 is unable to operate due to the absence of a suitable power source. During the transit time, the cryogen is allowed to boil, keeping the coils 12 at the required temperature. The cryogen thus acts as a thermal battery. Service neck 20 provides an escape path for boiled off cryogen to leave the cryogen vessel 14. The boiled off cryogen is allowed to vent to atmosphere. The system may be required to be capable of remaining in this boiling thermal battery state for a duration of up to about 30 days. When a cryogen such as helium is used, the cost of the cryogen lost by boiling may become significant.

It is required to keep the coils at a low temperature, since otherwise the commissioning of the system on installation becomes difficult and time consuming. If the system has heated up to ambient temperature, which will happen if the liquid cryogen boils dry, the system must be cooled and refilled with liquid cryogen before being commissioned. In some regions of the world, it is very difficult to obtain the large supplies of the liquid cryogen required for such an operation if not planned for in advance. Such a re-cooling and refilling is also time consuming, and costly both in terms of the time a field engineer must spend on site installing the system, and the material cost of the cryogen used.

The distribution and cost of large quantities of helium required for such cryogen baths is causing difficulties, and may prevent the installation of equipment in remote locations. It is a further object of the present invention to reduce the quantity of liquid cryogen required in the magnet system, and to reduce the requirement for replenishing the liquid cryogen.

The present invention accordingly addresses these and other problems and provides apparatus and methods as defined in the appended claims.

The above, and further, objects, advantages and characteristics of the present invention will become more apparent from a consideration of the following description of certain embodiments, given by way of examples only, in conjunction with the accompanying drawings wherein.

Figure 1:
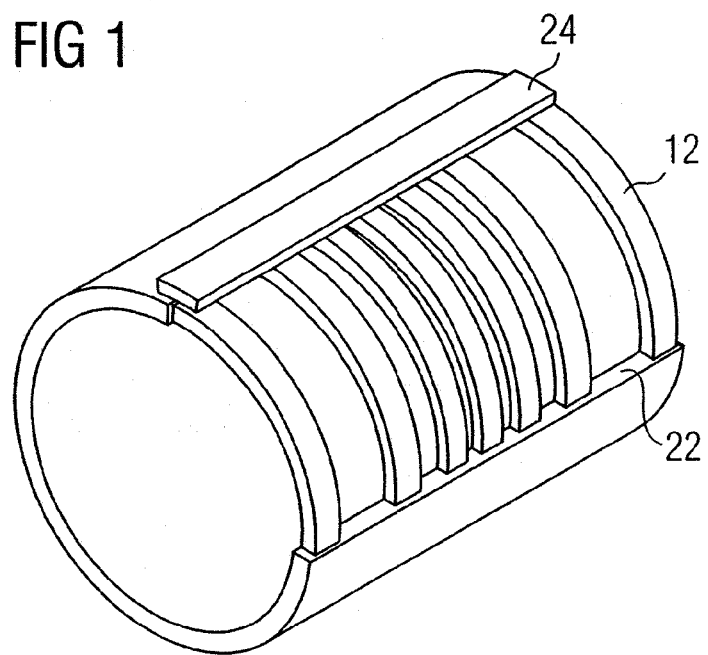
FIG. 1 represents a perspective view of an electromagnet according to the present invention.

FIG. 1 shows a partial cut-away perspective view of an electromagnet according to an embodiment of the present invention. A plurality of coils 12 are monolithically embedded within a thermosetting or thermoplastic material 22 which is solid at the temperature of operation of the electromagnet. Since the coils are embedded in a solid material, individual conductors have no freedom to move, even under significant force caused by elevated currents flowing through an intense magnetic field. The moulding step should preferably be carried out in a vacuum to ensure that no voids are present, particularly in between conductors of a particular coil. By ensuring that solid material fills all spaces between conductors of a coil, the possibility of movement of the conductors is removed.

Similarly, by monolithically embedding the plurality of coils 12 within a single artefact of solid material, the possibility of relative movement between the coils is also removed.

Feature 24 is a heat exchanger manifold, whose function will be briefly described below with reference to certain embodiments of the invention.

Figure 2:
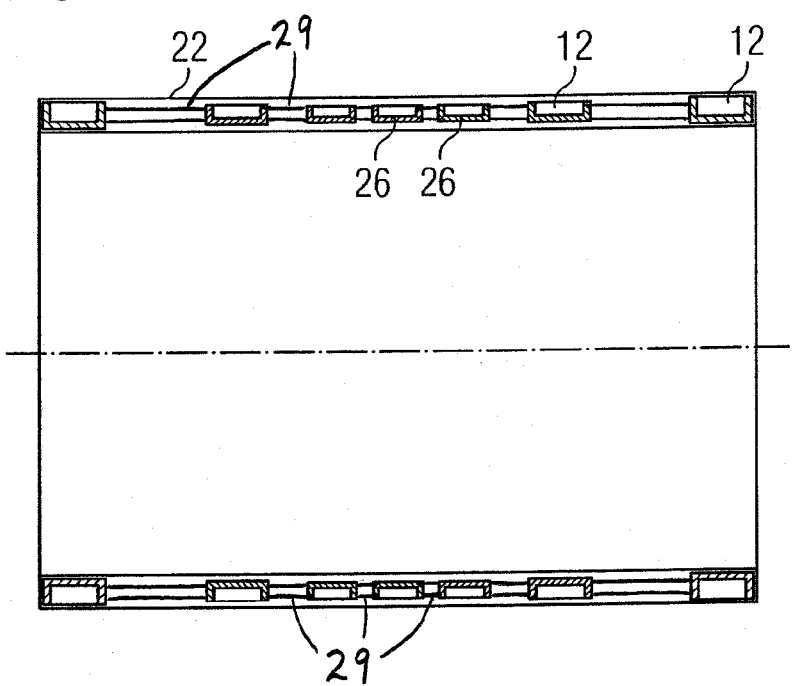
FIG. 2 represents an axial cross-section of an electromagnet according to the present invention, such as that shown in FIG. 1.

FIG. 2 shows an axial cross-section of the electromagnet structure of FIG. 1. As shown, the coils 12 may be of differing sizes, and spacing. The coils may include field coils, RF coils and shield coils among others. The function and arrangement of each type of coil is well known in the relevant art. In order to achieve and maintain the required level of magnetic field homogeneity, the spacing between the coils must be accurately set, and must be maintained despite forces experienced by the coil as a result of their conducting high levels of current through an intense magnetic field. The present invention provides this stability by embedding the coils 12 in a monolithic solid structure.

Figure 4:
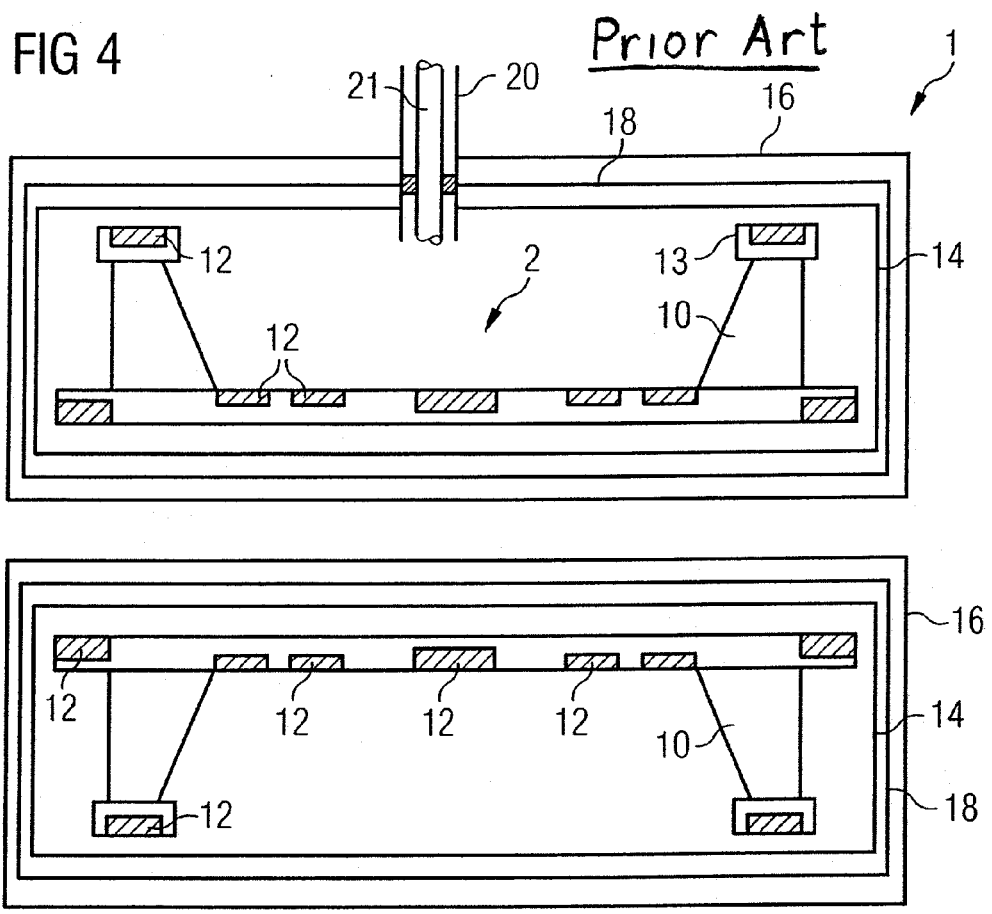
FIG. 4 represents a cryostat housing a solenoidal superconducting magnet according to the prior art.

In typical known solenoidal electromagnets, a solid former such as shown at 10 in FIG. 4 is provided. This may be of a composite material such as fiberglass reinforced resin, or any material of relatively low thermal conductivity, such as certain grades of stainless steel. The coils 12 are then wound into recesses in the former, or are wound onto support structures such as 13, which are then assembled onto the former itself. An advantage according to certain embodiments of the present invention is that a former such as shown at 10 in FIG. 4 is no longer required. As illustrated in FIGS. 1 and 2, a solenoidal electromagnet according to the present invention is formed by embedding a plurality of coils in a monolithic solid structure of thermoplastic or thermosetting materials. No former is needed, since the structural strength of the electromagnet is provided by the thermosetting or thermoplastic material. The absence of a former in the electromagnet of the present invention may lead to a reduction in the size and weight of the structure. Of course, if required, a former may still be employed, in which case the former is embedded with the coils into the monolithic thermoplastic or thermosetting material.

In embodiments where no former is provided, the coils may need a retaining structure into which they are wound. As illustrated in FIG. 2, the coils 12 may be wound into preformed journals 26. These preformed journals define the dimensions of the coil and hold the conductor in place prior to the coils being embedded. The size of the journals, and the separation between them, must be accurately controlled. In certain embodiments, mechanical spacers 29 (shown schematically in FIG. 2 may be provided to hold the coils, and the journals if provided, at the appropriate relative positions. Preferably, journals 26 are provided having such spacers integrally formed therewith.

Figure 3:
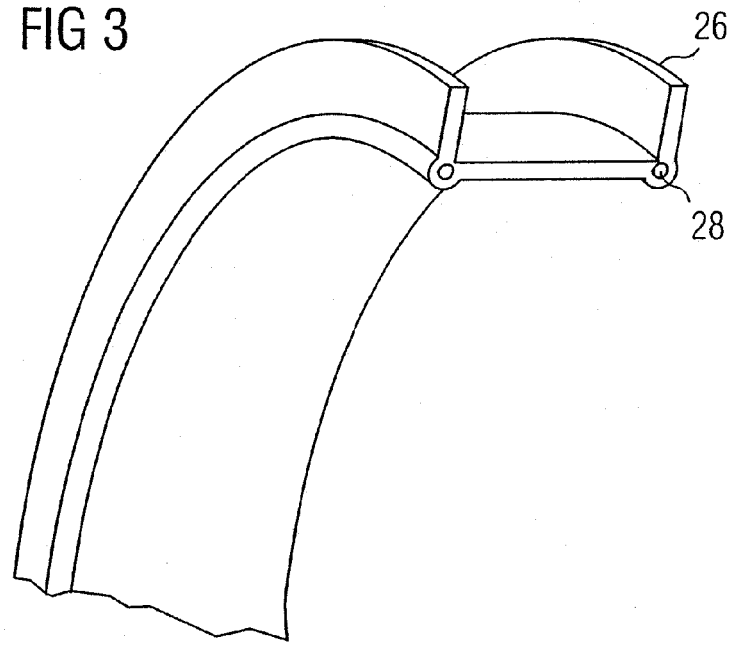
FIG. 3 represents a cross-section and partial perspective view of a journal, used to accommodate magnetic coils in certain embodiments of the present invention.

An example journal 26 is more clearly shown in FIG. 3. As shown in FIG. 3, the journal 26 may have one or more channels 28 running through it. The purpose of these channels will be explained later. The preformed journal may appropriately be formed from one of a large variety of materials. The material must be able to withstand pressure from the coils and the temperature of operation of the electromagnet when in operation. For example, certain plastics, sand-filled resin or open celled foam may be used. Open celled foams are particularly attractive since the thermoplastic or thermosetting material will permeate through the open celled material of the journal 26, allowing it to more easily permeate through the conductors of the coils. The open celled foam material effectively becomes part of the thermoplastic or thermosetting material, adding to the security of the conductors of coils 12 within the material, compared with journals made of a non-permeable material which will present a continuous interface with the thermoplastic or thermosetting resin, adding the possibility of delamination. On the other hand, an epoxy resin based journal 26 bonds effectively with an epoxy based thermosetting material. Other combination of thermosetting or thermoplastic material with a similar material for the journals may also be expected to provide good bonding characteristics.

In a particularly preferred embodiment, the journals are made of aluminium or copper open celled foam.

In prior art arrangements such as shown in FIG. 4, a difficulty has existed in leading conductors from the various coils 12 to a termination board. As has been discussed above, even a small amount of movement in a superconductor wire may generate enough local heating to bring about a quench. Although superconductor wire within coils 12 is held relatively immobile by tension and adjacent layers of superconductor wire, coil terminations are made by single superconducting wires which are led as cable runs along the former or other suitable structure to a termination board. These wires tend to move under the influence of the generated magnetic field, since they carry large currents. In order to prevent movement, and so avoid local heating and a quench, it has become normal practice to restrain the conductors to the former or other mechanical support at very short intervals, of the order of 5 mm with nylon cable ties or the like. Such operation is very time consuming, and not always effective. It is also time consuming to remove and replace these ties if required for servicing. According to an advantage of the present invention, such conductors leading from coils 12 to a termination board, and indeed the termination board itself, may be embedded within the thermosetting or thermoplastic material. This will prevent movement of the conductors, and may assist in servicing, as will be discussed further below. The termination board itself may be embedded within the thermosetting or thermoplastic material, or may be placed to be accessible from outside of the thermoplastic or thermosetting material. According to this aspect of the present invention, it is no longer necessary to provide tie bars, the mechanical structures formerly provided for supporting the superconducting wires in cable runs.

The present invention provides an electromagnet comprising coils embedded in a thermoplastic or thermosetting material which is solid at the temperature of operation of the electromagnet. Since current superconductive electromagnets typically operate at a temperature of 4K, certain materials not normally considered to be thermoplastic solids have been found suitable for use as the embedding material in the present invention.

Examples of effective thermoplastic materials include room-temperature organic thermoplastic resins and solids such as polyethylene and paraffin wax, along with other materials such as water and nitrogen. Water and nitrogen have been found to be particularly strong in compression. Water should be purified before use, for example by boiling. Examples of effective thermosetting materials include organic thermosetting resins. The thermoplastic or thermosetting embedding material may be filled with a suitable filler material. Examples include glass fibre, glass beads, sand, and gravel.

If, following the monolithic embedding of coils 12 in a thermoplastic material 22, it is necessary to remove one of the coils for servicing, this may achieved simply by raising the temperature of the electromagnet structure above the melting or boiling point of the thermoplastic material. The coils then become simple to remove. Once the coil is replaced, or a substitute is provided, the embedding process is performed again, with the coils being held in position at least until the thermoplastic material has solidified. For nitrogen, the electromagnet need only be raised above about 80K, for water above about 273K, and for paraffin wax, above about 350K. This operation is not so simple if a thermosetting material 22 is used. However, the use of a thermosetting material may be preferred in examples where it is not desired for the material to revert to its liquid state on warming.

The present invention provides superconducting coils embedded in a monolithic solid piece of embedding material, being a thermosetting or thermoplastic material. When such an assembly is to be brought to operating temperature, a difficulty may arise in cooling the monolithic solid piece. If an embedding material of low thermal conductivity is used, for example nitrogen, an outer surface of the embedding material may be cooled to a very low temperature while material deeper within the solid piece is still at a higher temperature. The outer surface may then thermally contract, while the inner regions are not contracting. This will set up stresses within the piece, and a risk of fracture or delamination will exist. To avoid or alleviate this problem, cooling tubes may be added in to the structure before the embedding material is added. In this case, cryogen may be circulated through the cooling tubes to assist with cooling the piece to operating temperature. Since cooling may then be applied both to the exterior and the interior of the embedding material, the thermally induced stresses and the resultant risk of fracture or delamination may be avoided. A more even cooling of the piece may be achieved.

As mentioned earlier, the journals 26 may incorporate channels 28. These channels may be used as cooling tubes as described in the preceding paragraph. These channels, if provided, must have continuous walls. That is, even in embodiments where the journals are formed from open celled foam, the channels must have continuous walls to prevent the ingress of the embedding material into the channels 28. A skinned foam material may be useful in this application. A particular advantage of providing cooling channels 28 integrally within the journals 26 as shown in FIG. 3 is that cooling is provided in close proximity to the superconducting coils. This will help to assure effective cooling of the coils to operating temperature in operation. A heat exchanger manifold such as shown at 24 in FIG. 1 is employed to carry cryogenic fluid to the channels 28.

In certain particularly advantageous embodiments, cooling of the coils may be provided solely by circulation of cryogen through the channel 28. In such embodiments, it may no longer be necessary to provide a cryogen vessel 14, or a quantity of liquid cryogen for immersion of the coils. A small quantity of liquid cryogen, for example 35 litres, may be provided in a small sump, and may be caused to circulate around the channels 28 of each coil, providing more direct cooling to the coils, and avoiding the need to supply and maintain a large quantity of liquid cryogen. In such embodiments, the cryogen tank 14 need not be provided, and the coils embedded in the embedding material with the sump may be placed in the outer vacuum chamber 16. Thermal shields 18 may still be provided. The overall system may be made smaller, lighter and less costly. In addition, the patient bore may be made wider and/or shorter since there would be no cryogen vessel to accommodate.

Manufacture of the embedded coil assembly of the present invention may proceed as follows. An appropriate mould may be provided. For the embodiment illustrated in FIG. 1, a cylindrical mould is required. This may be provided, for example, as two concentric cylinders of stainless steel coated in a suitable release agent. End pieces would be needed. The coils 12 are arranged in the required relative positions within the mould. As described herein, this may be arranged by mechanical attachment of the coils, optionally within journals 26, to mechanical spacers. Alternatively, mechanical spacers may be integrally formed with journals 26. The mould is then filled with the chosen embedding material. If the chosen embedding material is a thermoplastic material, the temperature of the mould and its contents must be kept below the solidifying temperature of the thermoplastic material. It may be found convenient to arrange the mould with its axis vertical. It may also be found convenient to provide one of the cylinders, most probably the outer cylinder, as several pieces which may be assembled around the coils and disassembled to reveal the moulded article. Alternatively, the mould may be left in place, a permanent feature which may add to the mechanical strength of the finished article.

Alternatively, particularly where thermosetting materials are used as the embedding material, it may be found possible to apply the embedding material to the coils and the journals and spacers as appropriate without the use of a mould, for example by brushing epoxy resin onto the coils, laying resin-impregnated glass fibre matting over the structure, out-gassing in a vacuum then compressing the structure by any suitable means, such as an inflatable cuff.

The coils are wound in a conventional manner, onto journals such as shown in FIG. 3, or a former such as shown in FIG. 4. In certain embodiments, a former such as shown in FIG. 4 may be provided, but made of an open celled foam material, which is later filled by the embedding material.

Suspension of the magnet assembly within the outer vacuum chamber 16 can be provided by attaching suspension members directly to the embedded coil assembly. This may be particularly suitable in embodiments using an embedding material of very low thermal conductivity.

Further properties of the resultant electromagnet may be determined by appropriate selection of the materials used. The embedding material may be chosen to be lightweight, for example paraffin wax. Stronger solid materials may be preferred if the electromagnet is to be transported at ambient temperature. On the other hand, the embedding material may be chosen to be heavy, for example sand and/or gravel filled resin. A heavy system provides advantages in reduced floor vibration. If required, embedding of the coils with such materials may be done at the installation site, to facilitate transport.

Advantageously, according to certain embodiments of the invention, the electrical conductivity of the journals or former may be controlled by selection of the materials used. For example, a copper or aluminium foam former or journals may be used, and the degree of porosity may be controlled to provide the required electrical conductivity. The electrical conductivity may be selected to provide a required behaviour during a quench, for example to limit a burst of magnetic field during a quench, or to control the magnitude of eddy current which may flow during imaging. Such eddy currents may reduce the quality of the final images.

While the invention has been described with particular reference to thermosetting and thermoplastic materials, at least some of the advantages of the present invention may be obtained by monolithically embedding the plurality of coils of a superconducting magnet in any material which becomes solid and is solid at the operating temperature of a superconductive magnet. Examples of such materials include, but need not be limited to, thermoplastics, thermosetting resins, ceramic slurries, cements, concrete, and plaster. These latter materials undergo irreversible reactions to become solid, having much the same effect as thermosetting resins.

The invention claimed is:

1. An electromagnet comprising a plurality of coils of superconductive material, arranged for cryogenic cooling, wherein
    the coils in said plurality of coils of superconductive material are monolithically embedded within a single artifact formed of an embedding material that is solid at the temperature of operation of the superconductive electromagnet;
    at least one of the coils is wound into a preformed journal that is embedded within said embedding material that forms said single artifact; and
    the preformed journal comprises at least one integral cooling channel for circulation of a liquid cryogen therethrough.

2. An electromagnet according to claim 1, wherein the preformed journal is at least partially formed of a porous material and the embedding material permeates the porous material.

3. An electromagnet according to claim 2, wherein the porous material is a metal foam.

4. An electromagnet according to claim 1, wherein the embedding material is a thermosetting material or a thermoplastic material.

5. An electromagnet according to claim 4 wherein the embedding material comprises one of: water, nitrogen, paraffin wax.

6. An electromagnet according to claim 4 wherein the embedding material comprises an organic resin.

7. A solenoidal electromagnet comprising a plurality of coaxial coils of superconductive material, spaced axially apart, wherein:
    the coils in the plurality of coils of superconductive material are monolithically embedded within a monolithic supporting structure comprising a single artifact formed of an embedding material that is solid at the temperature of operation of the superconductive electromagnet;
    the solenoidal electromagnet is arranged for cryogenic cooling by at least partial immersion in a bath of liquid cryogen; and
    a number of cooling channels are provided in the embedding material, for circulation of a liquid cryogen therethrough.

8. An electromagnet comprising a plurality of coils of superconductive material, wherein:
    the coils in the plurality of coils of superconductive material are monolithically embedded within a monolithic supporting structure comprising a single artifact formed of an embedding material that is solid at the temperature of operation of the superconductive electromagnet;
    at least one of the coils is wound into a preformed journal; and the preformed journal comprises at least one integral cooling channel for circulation of a liquid cryogen therethrough.

9. An electromagnet according to claim 8, wherein the coils are held apart at appropriate relative positions by spacers mechanically associated with the coils.

10. An electromagnet according to claim 9, wherein the spacers are integrally formed with at least one preformed journal.

11. An electromagnet comprising a plurality of coils of superconductive material, wherein:
    the coils in the plurality of coils of superconductive material are monolithically embedded within a monolithic supporting structure comprising a single artifact formed of an embedding material that is solid at the temperature of operation of the superconductive electromagnet;
    at least one of the coils is wound into a preformed journal; and
    the preformed journal is at least partially formed of a porous material and the embedding material permeates the porous material.

12. A solenoidal electromagnet comprising a plurality of coaxial coils of superconductive material, spaced axially apart and arranged for cryogenic cooling, wherein:
    the coils in said plurality of coils of superconductive material are monolithically embedded within a single artifact comprising a monolithic solid structure made of a thermoplastic or thermosetting material that is solid at the temperature of operation of the superconductive electromagnet, such that said coils are supported and held in position relative to each other by said monolithic solid structure, and relative movement of the coils is thereby prevented;
    the coils are held apart at appropriate relative axial positions by spacers mechanically associated with the coils within said monolithic supporting structure;
    the spacers are integrally formed with at least one preformed journal; and
    the preformed journal is at least partially formed of a porous material and the embedding material permeates the porous material.

13. An electromagnet according to claim 12, wherein the porous material is a metal foam.

* * * * *